(12) United States Patent
Kim et al.

(10) Patent No.: US 7,075,352 B2
(45) Date of Patent: Jul. 11, 2006

(54) LATCH-BASED PULSE GENERATOR

(75) Inventors: Do-Kyung Kim, Suwon (KR); Yong-Weon Jeon, Suwon (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 16 days.

(21) Appl. No.: 10/774,680

(22) Filed: Feb. 9, 2004

(65) Prior Publication Data
US 2004/0160257 A1 Aug. 19, 2004

(30) Foreign Application Priority Data
Feb. 18, 2003 (KR) .................. 10-2003-0010050

(51) Int. Cl.
*G06F 1/04* (2006.01)
*H03K 3/00* (2006.01)

(52) U.S. Cl. ........................... 327/291; 327/294

(58) Field of Classification Search ........ 327/291–297, 327/299, 141, 155; 377/47, 48
See application file for complete search history.

(56) References Cited

U.S. PATENT DOCUMENTS

| 4,703,495 A | * | 10/1987 | Bereznak | 377/108 |
| 4,780,894 A | * | 10/1988 | Watkins et al. | 377/34 |
| 5,150,386 A | * | 9/1992 | Stern et al. | 375/371 |
| 6,707,326 B1 | * | 3/2004 | Magoon et al. | 327/115 |
| 6,760,397 B1 | * | 7/2004 | Wu et al. | 377/47 |

FOREIGN PATENT DOCUMENTS

| JP | 5-48407 | 2/1993 |
| KR | 1997-0055483 | 7/1997 |

* cited by examiner

*Primary Examiner*—Tuan T. Lam
(74) *Attorney, Agent, or Firm*—F.Chau & Associates, LLC (57) ABSTRACT

There is provided a pulse generator capable of generating a pulse with a reduced number of transistors that toggle in response to a clock signal, thereby reducing power consumption. The pulse generator includes a plurality of unit cells, wherein an nth unit cell (n is a natural number more than 2) generates a pulse in response to a divided-by-N clock signal (N is a natural number), a signal output from an $(n-1)^{th}$ unit cell and a signal output from an $(n+1)^{th}$ unit cell. The $n^{th}$ unit cell is reset or generates the pulse whose width is equivalent to the width of the clock signal, according to the logic level of the signal output from the $n+1^{th}$ unit cell.

10 Claims, 8 Drawing Sheets

LATCH-BASED PULSE GENERATOR

BACKGROUND OF THE INVENTION

1. Technical Field

The present invention relates to a pulse generator, and more particularly, to a latch-based pulse generator, which is used in an active matrix type thin film transistor liquid crystal display (TFT-LCD) driver.

2. Discussion of the Related Art

Figure 1:
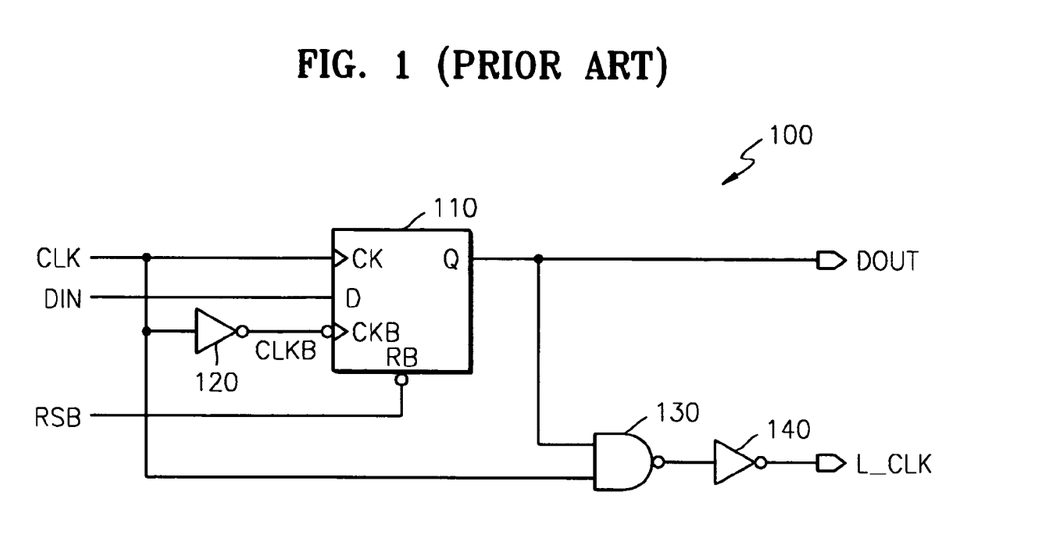
FIG. 1 is a circuit diagram of a conventional flip-flop-based pulse generator.

FIG. 1 is a circuit diagram of a common pulse generator 100. Referring to FIG. 1, the pulse generator 100 includes inverters 120 and 140, a flip-flop 110, and a NAND gate 130. As shown in FIG. 1, the inverters 120 and 140 (i.e., complementary metal oxide semiconductor (CMOS) inverters) include positive channel metal oxide semiconductor (PMOS) and negative channel metal oxide semiconductor (NMOS) transistors. The NAND gate 130 also includes two PMOS and NMOS transistors.

The flip-flop 110 latches data DIN input to an input terminal D and outputs the result of the latching to an output terminal Q in response to a clock signal CLK input to a clock terminal CK and a complementary clock signal CLKB input to a complementary clock terminal CKB. The flip-flop 110 is reset in response to a falling edge of a reset signal RSB input to a reset terminal RB.

Figure 2:
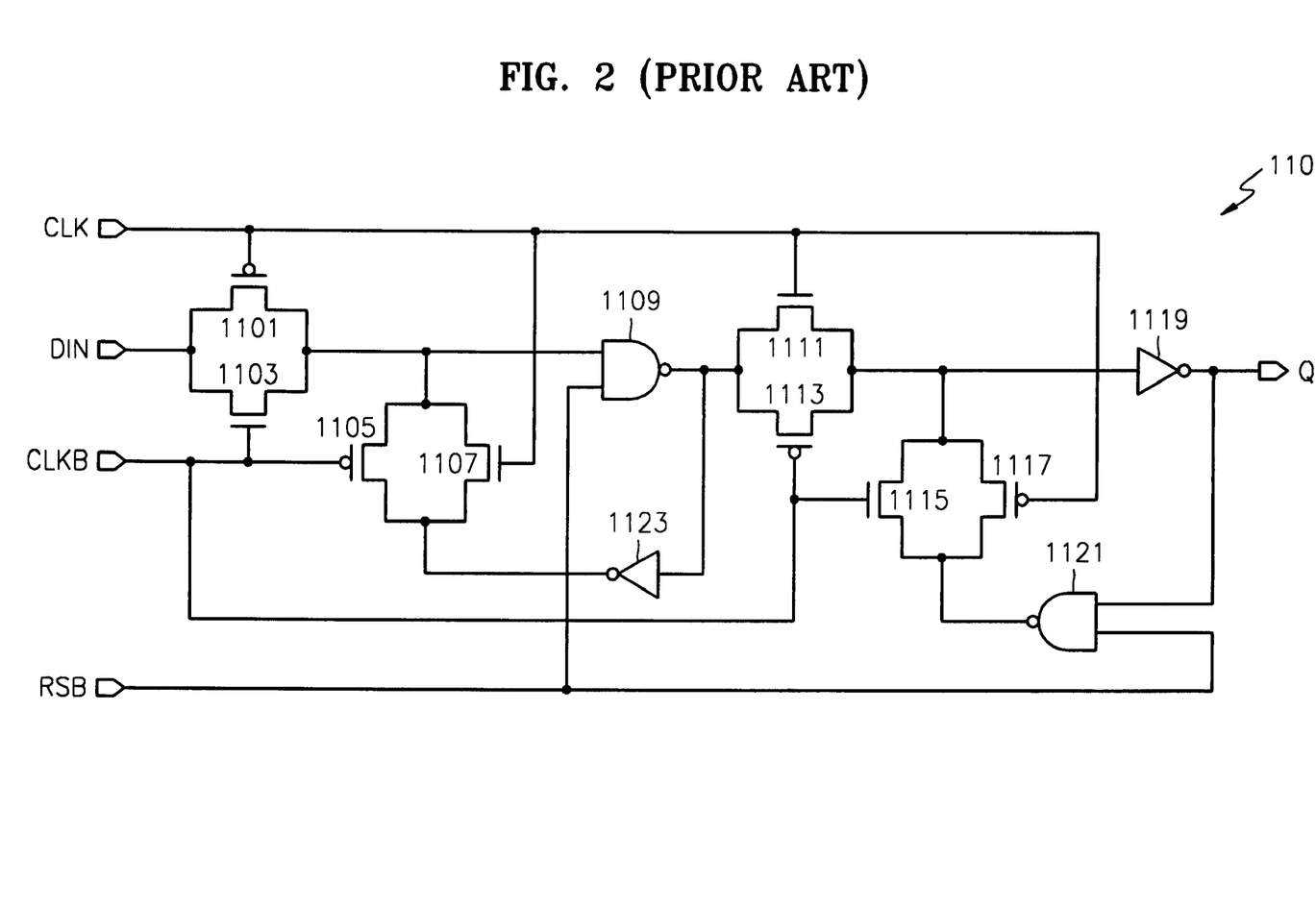
FIG. 2 is a circuit diagram of a flip-flop shown in FIG. 1.

FIG. 2 is a circuit diagram of the flip-flip 110 shown in FIG. 1. Referring to FIG. 2, the flip-flop 110 includes PMOS transistors 1101, 1105, 1113, and 1117, NMOS transistors 1103, 1107, 1111, and 1115, two inverters 1119 and 1123, and two NAND gates 1109 and 1121.

Referring to FIGS. 1 and 2, the transistors 1101, 1107, 1111, and 1117, the inverter 120, and the NAND gate 130 toggle in response to the clock signal CLK, and the transistors 1103, 1105, 1113, and 1115 toggle in response to the complementary clock signal CLKB.

Figure 3:
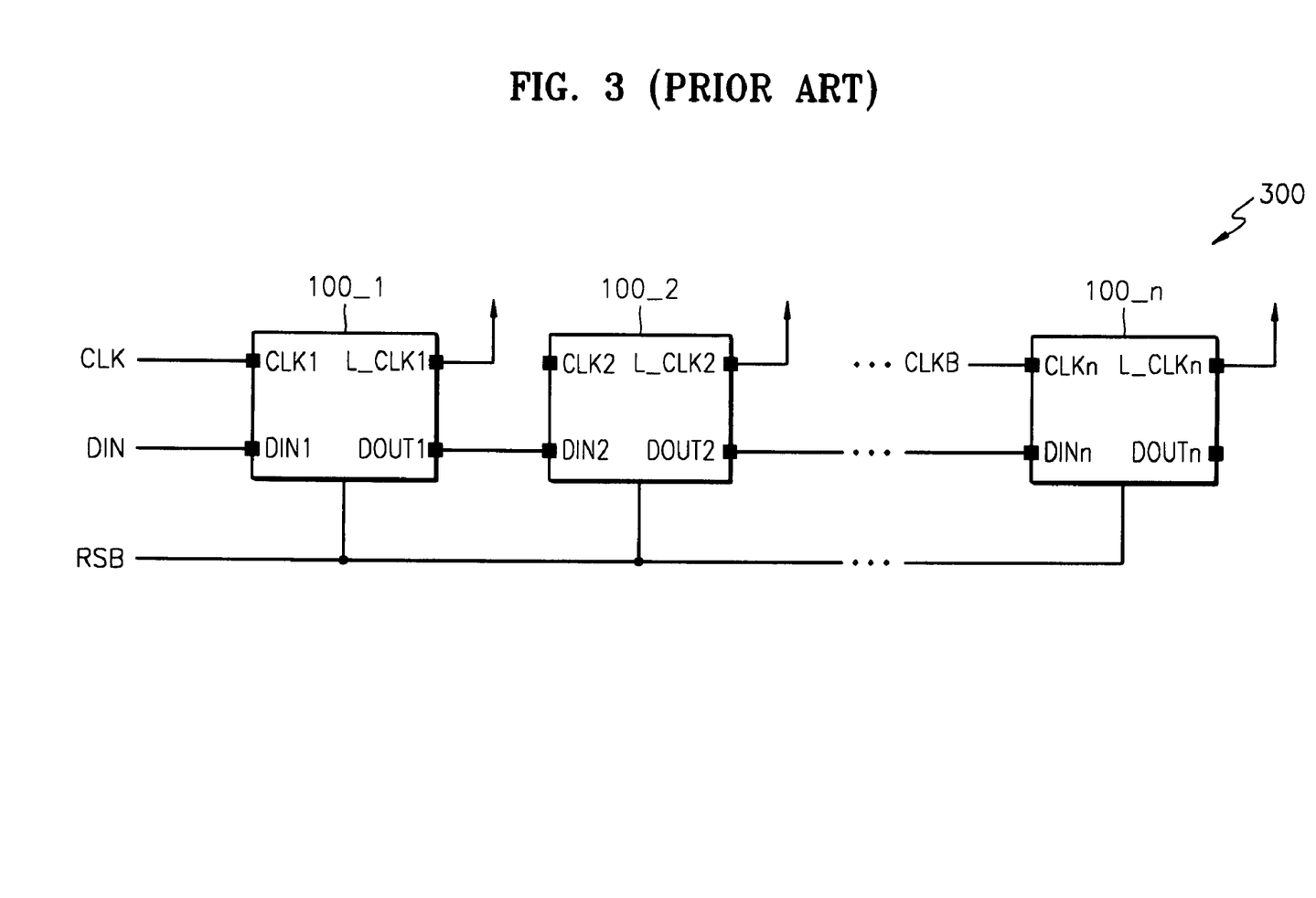
FIG. 3 is a circuit diagram of a conventional pulse generator capable of sequentially latching n data.

FIG. 3 is a circuit diagram of a pulse generator 300 that sequentially latches n data. The pulse generator 300 includes first through $n^{th}$ pulse generators 100_1, 100_2 ... 100_n. The structure of each of the first through $n^{th}$ pulse generators 100_1, 100_2 ... 100_n is the same or similar to that of the pulse generator 100 of FIG. 1.

The pulse generator 100_1 receives and latches an input signal DIN in response to a clock signal CLK and outputs two output signals DOUBT and L_CLK1. The output signal DOUBT is input to an input terminal DIN2 of a second pulse generator 100_2 and the other output signal L_CLK1 is used as a pulse for latching data.

The second pulse generator 100_2 receives and latches the output signal DOUBT in response to an inverted clock signal CLKB and outputs two output signals DOUT2 and L_CLK2. The output signal DOUT2 is input to an input terminal of a third pulse generator, and the output signal L_CLK2 is used as a pulse for latching data.

In the pulse generator 300, the first through $n^{th}$ pulse generators 100_1, 100_2 ... 100_n, are connected in series and generate pulses L_CLK1, L_CLK2 ... L_CLKn, respectively, in response to clock signals CLK and CLKB. Thus, the pulses L_CLK1, L_CLK2 ... L_CLKn, which are used to latch related data, are sequentially generated.

For instance, when latching 128 bits of data, a minimum of 128 input clock signals CLK or CLKB are required. In doing so, each of the pulse generators 100_1, 100_2 ... 100_n, which include the transistors 1101, 1103, 1105, 1107, 1111, 1113, 1115, and 1117, toggle the clock signals CLK and CLKB. Therefore, the output of one pulse generator (e.g., the pulse generator 100_n) toggles a minimum of 127 times to generate a pulse L_CLKn, resulting in excess power consumption.

SUMMARY OF THE INVENTION

The present invention provides a pulse generator capable of generating a pulse with a reduced number of transistors that toggle in response to a clock signal, thereby reducing power consumption.

According to an aspect of the present invention, there is provided a pulse generator comprising a plurality of unit cells, wherein an $n^{th}$ unit cell (n is a natural number more than 2) generates a pulse in response to a divided-by-N clock signal (N is a natural number), a signal output from an $(n-1)^{th}$ unit cell and a signal output from an $(n+1)^{th}$ unit cell.

The $n^{th}$ unit cell is reset or generates the pulse whose width is equivalent to the width of the clock signal, based on the logic level of the signal output from the $(n+1)^{th}$ unit cell. The phases of the signal output from the $(n-1)^{th}$ unit cell and the signal output from the $(n+1)^{th}$ unit cell are changed with a time difference.

The $n^{th}$ unit cell comprises a first NAND gate that NANDs the signal output from the $(n-1)^{th}$ unit cell and the signal output from the $(n+1)^{th}$ unit cell, a first inverter that inverts a signal output from the first NAND gate, a second NAND gate that NANDs the divided-by-N clock signal and a signal output from the first inverter, a second inverter that inverts a signal output from the second NAND gate and outputs the pulse as an inverted signal, and a latch that latches a reset signal and the signal output from the second NAND gate.

The second NAND gate comprises first and second PMOS transistors, and first and second NMOS transistors, wherein the divided-by-N clock signal is input to a gate of the first PMOS transistor and a gate of the first NMOS transistor, and a signal output from the first inverter is input to a gate of the second PMOS transistor and a gate of the second NMOS transistor.

According to another aspect of the present invention, there is provided a pulse generator comprising a plurality of unit cells, wherein a divided-by-N clock signal (N is a natural number), a signal output from the second output terminal of an $n-1^{th}$ unit cell (n is a natural number more than 2), and a signal output from a third output terminal of an $n+1^{th}$ unit cell are input to a first input terminal, a second input terminal, and a third input terminal of an $n^{th}$ unit cell of the plurality of unit cells, respectively, wherein the $n^{th}$ unit cell outputs a pulse whose width is equivalent to the width of the divided-by-N clock signal to a first output terminal of the $n^{th}$ unit cell in response to the signals that are input to the first, second and third input terminals of the $n^{th}$ unit cell.

The $n^{th}$ unit cell is reset or outputs the pulse whose width is equivalent to the width of the divided-by-N clock signal to the first output terminal of the $n^{th}$ unit cell, based on the logic level of the signal output from the third output terminal of the $(n+1)^{th}$ unit cell. The phases of the signal output from the second output terminal of the $n-1^{th}$ unit cell and the signal output from the third output terminal of the $n+1^{th}$ unit cell are changed with a time difference.

The $n^{th}$ unit cell comprises a first NAND gate that NANDs the signal which is output from the $n-1^{th}$ unit cell and input to the second input terminal of the $n^{th}$ unit cell, and the signal which is output from the $n+1^{th}$ unit cell and input to the third input terminal of the $n^{th}$ unit cell; a first inverter that inverts a signal output from the first NAND gate; a second NAND gate that NANDs the divided-by-N clock signal input to the first input terminal of the $n^{th}$ unit cell and a signal output from the first inverter; a second inverter that inverts a signal output from the second NAND gate and outputs an inverted signal as the output signal of the $n^{th}$ unit cell; and a latch that latches a reset signal, and a signal output from the second NAND gate.

The $n^{th}$ unit cell comprises a first NAND gate that NANDs the signal which is output from the $n-1^{th}$ unit cell and input via the second input terminal of the $n^{th}$ unit cell, and the signal which is output from the $n+1^{th}$ unit cell and input via the third input terminal of the $n^{th}$ unit cell; a first inverter that inverts a signal output from the first NAND gate; a second NAND gate that NANDs the divided-by-N clock signal input via the first input terminal of the $n^{th}$ unit cell and a signal output from the first inverter; a second inverter that inverts a signal output from the second NAND gate and outputs an inverted signal as an output signal of the $n^{th}$ unit cell; a first transmission circuit that responds to the signal output from the second NAND gate and the signal output from the second inverter; a second transmission circuit that responds to the signal output from the second NAND gate and the signal output from the second inverter; a third NAND gate that NANDs a reset signal and a signal output from a shared node and outputs the result of NAND to the third output terminal of the $n^{th}$ unit cell; and a third inverter that inverts the signal output from the third NAND gate and outputs an inverted signal to the second output terminal of the $n^{th}$ unit cell.

According to yet another aspect of the present invention, there is provided a pulse generator comprising a first NAND gate that NANDs a first input signal and a second input signal; a first inverter that inverts a signal output from the first NAND gate; a second NAND gate that NANDs a divided-by-N clock signal and a signal output from the first inverter; a second inverter that inverts a signal output from the second NAND gate; and a latch that latches a reset signal and the signal output from the second NAND gate. The second inverter generates a pulse corresponding to the divided-by-N clock signal in response to the second input signal.

According to still another aspect of the present invention, there is provided a pulse generator comprising a first NAND gate that NANDs a first input signal and a second input signal input to a second input terminal; a first inverter that inverts a signal output from the first NAND gate; a second NAND gate that NANDs a divided-by-N clock signal input to a first input terminal and a signal output from the first inverter; a second inverter; a first transmission circuit that responds to a signal output from the second NAND gate and a signal output from the second inverter; a second transmission circuit that responds to the signal output from the second NAND gate and the signal output from the second inverter; a third NAND gate that NANDs a reset signal and a signal output from the shared node and outputs the result of NAND to a third output terminal; and a third inverter. The second inverter generates a pulse whose width is equivalent to the width of the divided-by-N clock signal in response to the second input signal. In addition, the phases of the first and second input signals are changed.

BRIEF DESCRIPTION OF THE DRAWINGS

The above aspects of the present invention will become more apparent by describing in detail exemplary embodiments thereof with reference to the attached drawings, in which.

DETAILED DESCRIPTION OF EXEMPLARY EMBODIMENTS

Figure 4:
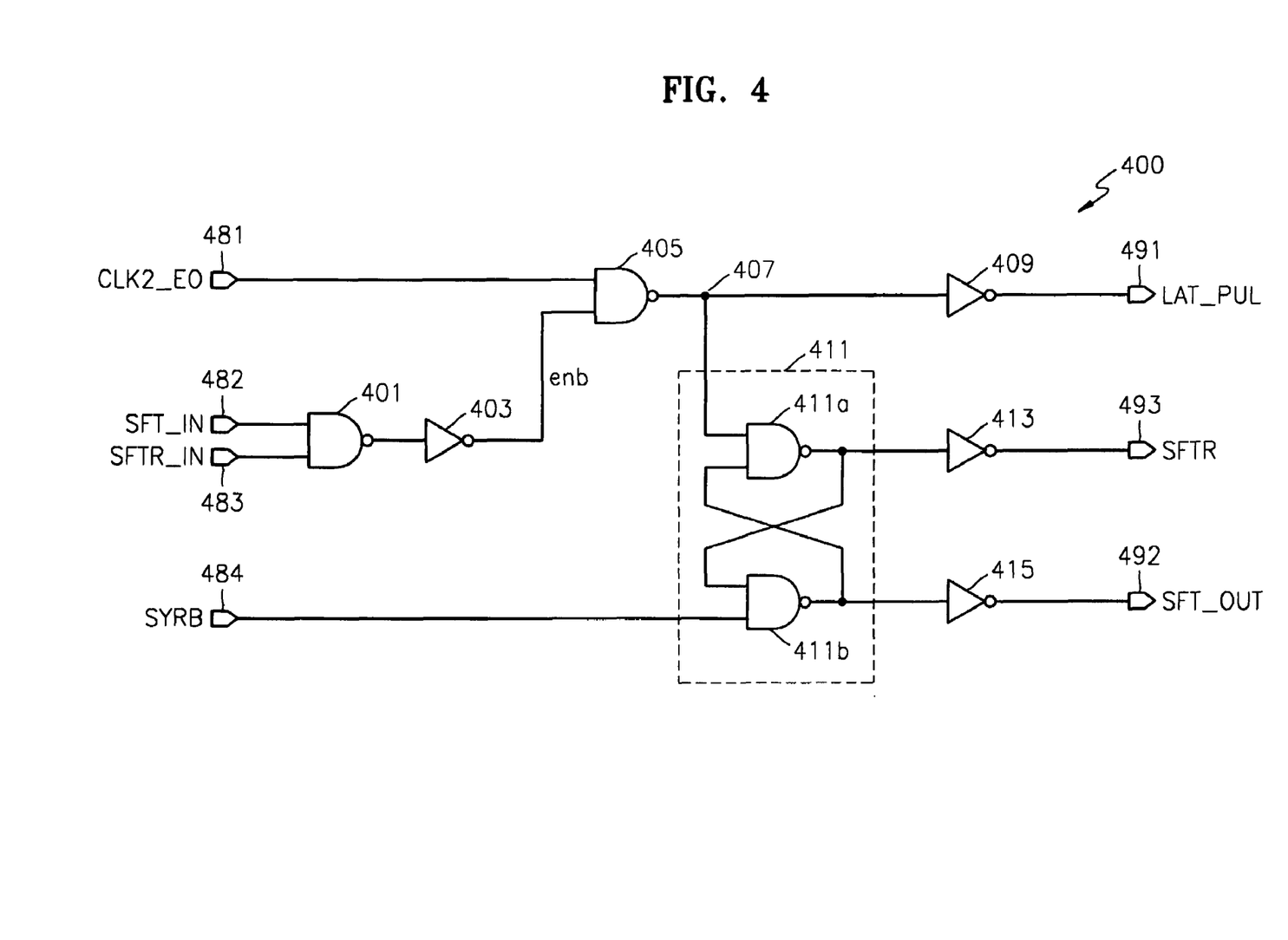
FIG. 4 is a circuit diagram of a latch-based pulse generator according to an exemplary embodiment of the present invention.

FIG. 4 is a circuit diagram of a latch-based pulse generator 400 according to an exemplary embodiment of the present invention. Referring to FIG. 4, the pulse generator 400 includes first, second and third input terminals 481, 482, 483 and first, second and third output terminals 491, 492, 493.

A first NAND gate 401 receives and NANDs an input signal SFT_IN input to the second input terminal 482 and an input signal SFTR_IN input via the third input terminal 483, and outputs the result of the NAND operation to a first inverter 403.

The level of the input signal SFTR_IN input to the third input terminal 483 is changed from a logic high level to a logic low level over a predetermined length of time after the level of the input signal SFT_IN input to the second input terminal 482 is changed from a logic low level to a logic high level.

The first inverter 403 receives and inverts the signal output from the first NAND gate 401 and outputs an inverted signal enb to a second NAND gate 405.

The second NAND gate 405 receives and NANDs a divided-by-N clock signal CLK2_EO (where N is 2) input to the first input terminal 481 and the inverted signal enb output from the first inverter 403, and outputs the result of the NAND operation to a second inverter 409 and a NAND gate 411a of a latch 411.

The second inverter 409 receives and inverts the signal output from the second NAND gate 405 and outputs an output signal LAT_PUL to the first output terminal 491. The output signal LAT_PUL is a pulse for latching data.

The latch 411 comprises two NAND gates 411a and 411b. The NAND gates 411a and 411b receive and latch a reset signal SYRB input via a fourth input terminal 484 and the signal output from the second NAND gate 405 as a set signal, respectively. The latch 411 may be an R-S latch.

A third inverter 413 receives and inverts a signal output from the NAND gate 411a and outputs an output signal SFTR to the third output terminal 493. A fourth inverter 415 receives and inverts a signal output from the NAND gate 411b and outputs an output signal SFT_OUT to the second output terminal 492.

The latch-based pulse generator 400 is reset according to the logic level of the signal SFTR_IN input to the third input terminal 483, or receives the divided-by-2 clock signal CLK2_EO via the first input terminal 481 and outputs it as an output signal LAT_PUL to the first output terminal 491. The latch-based pulse generator 400 is also reset in response to the reset signal SYRB.

Figure 5:
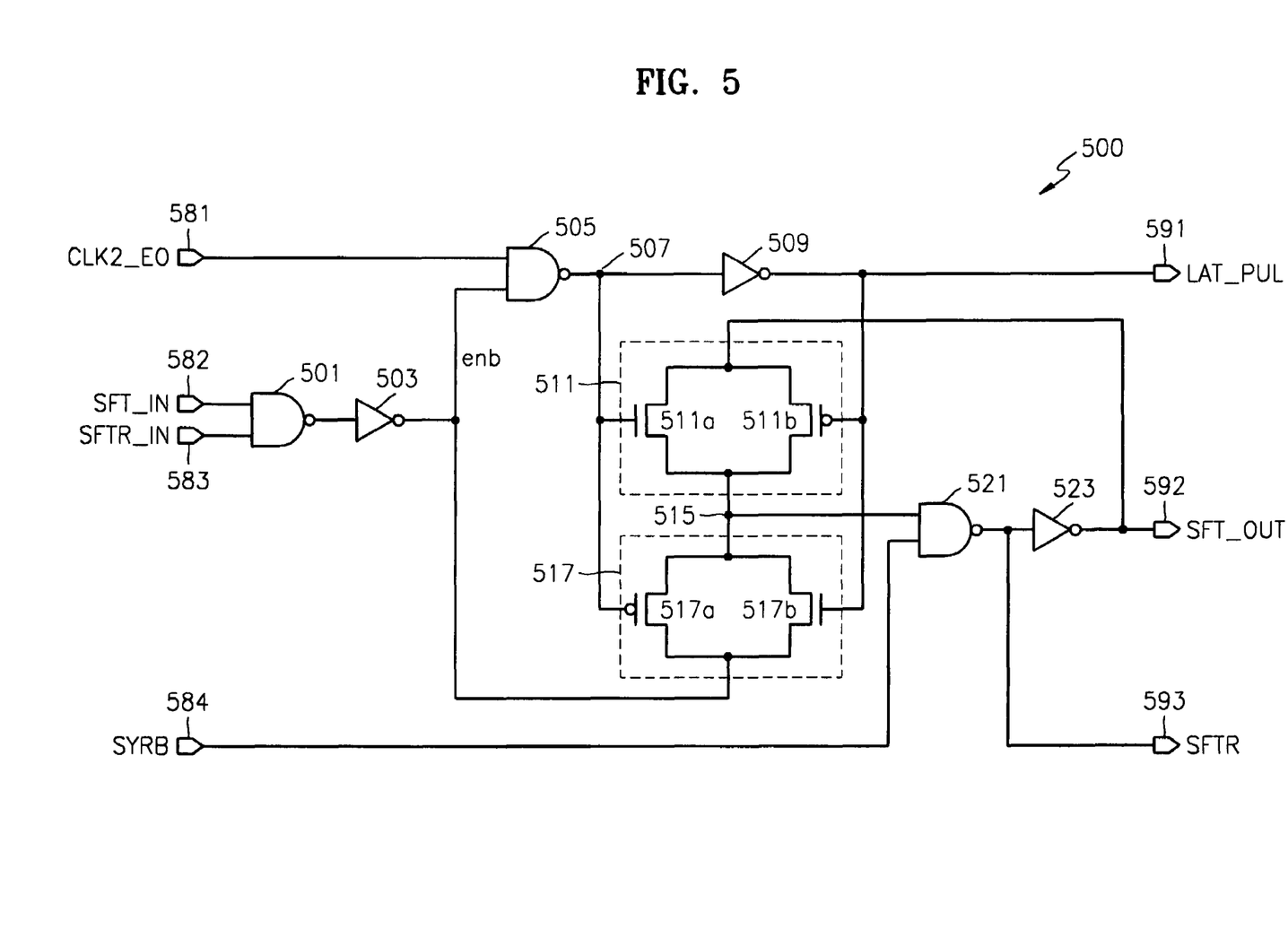
FIG. 5 is a circuit diagram of a latch-based pulse generator according to another exemplary embodiment of the present invention.

FIG. 5 is a circuit diagram of a latch-based pulse generator 500 according to another exemplary embodiment of the present invention. Referring to FIG. 5, the pulse generator 500 includes first, second and third input terminals 581, 582, 583 and first, second and third output terminals 591, 592, 593.

A first NAND gate 501 receives and NANDs an input signal SFT_IN from the second input terminal 582 and an input signal SFTR_IN from the third input terminal 583, and outputs the result of the NAND operation to a first inverter 503.

The level of the input signal SFTR_IN input to the third input terminal 583 is changed from a logic high level to a logic low level over a predetermined length of time after the level of the input signal SFT_IN input to the second input terminal 582 is changed from a logic low level to a logic high level.

The first inverter 503 receives and inverts a signal output from a first NAND gate 501 and outputs an inverted signal enb to a second NAND gate 505 and a second transmission circuit 517.

The second NAND gate 505 receives and NANDs a divided-by-2 clock signal CLK2_EO input via the first input terminal 581 and the enb signal output from the first inverter 503, and outputs the result of the NAND operation to a second inverter 509, a first transmission circuit 511, and the second transmission circuit 517.

The first transmission circuit 511 is connected between a shared node 515 and the second output terminal 592, and switches on or off between the shared node 515 and the second output terminal 592 in response to the signal output from an output terminal 507 of the second NAND gate 505 and a signal output from the second inverter 509.

The first transmission circuit 511 includes a negative channel metal oxide semiconductor (NMOS) transistor 511a and a positive channel metal oxide semiconductor (PMOS) transistor 511b. The NMOS transistor 511a and the PMOS transistor 511b are connected between the shared node 515 and the second output terminal 592. The signal output from the output terminal 507 of the second NAND gate 505 is input to the gate of the NMOS transistor 511a. The signal output from the second inverter 509 is input to the gate of the PMOS transistor 511b.

The second transmission circuit 517 is connected between the shared node 515 and the output terminal of the first inverter 503 and switches on or off between the shared node 515 and the output terminal of the first inverter 503 in response to the signal from the second NAND gate 505 and the signal output from the second inverter 509.

The second transmission circuit 517 includes an NMOS transistor 517b and a PMOS transistor 517a. Both the PMOS transistor 517a and the NMOS transistor 517b are connected between the shared node 515 and the output terminal of the first inverter 503. The signal output from the output terminal 507 of the second NAND gate 505 is input to the gate of the PMOS transistor 517a. A signal output from the second inverter 509 is input to the gate of the NMOS transistor 517b.

The second inverter 509 receives and inverts the signal output from the second NAND gate 505 and outputs an output signal LAT_PUL to the first output terminal 591. The output signal LAT_PUL is a pulse for latching data.

A third NAND gate 521 receives and NANDs a reset signal SYRB input via a fourth input terminal 584 and the signal output from the shared node 515, and outputs a signal SFTR as the result of the NAND operation to the third output terminal 593 and a third inverter 523.

The third inverter 523 receives and inverts the signal output from the third NAND gate 521 and outputs an inverted signal SFT_OUT to the second output terminal 592 and the first transmission circuit 511.

Figure 6:
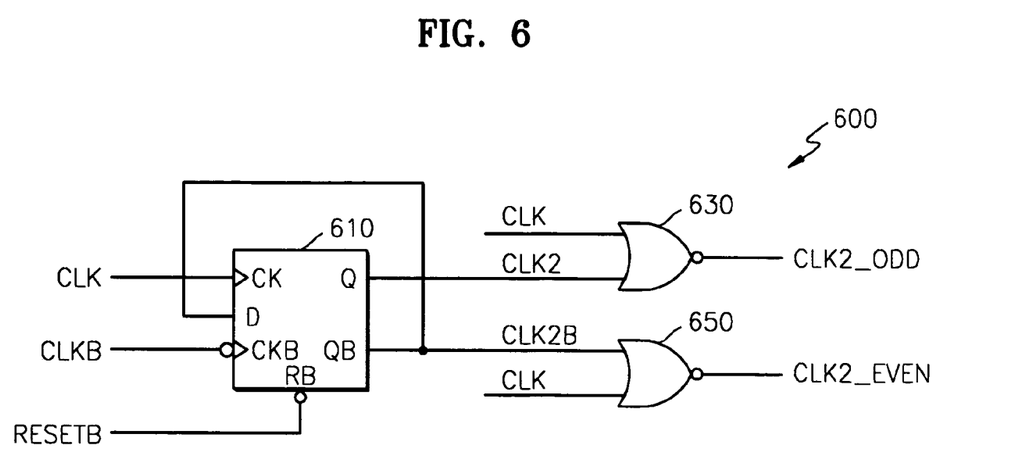
FIG. 6 is a circuit diagram of a clock signal generating circuit.

FIG. 6 is a circuit diagram of a clock signal generating circuit 600. Referring to FIG. 6, the clock signal generating circuit 600, which generates a divided-by-2 clock signal, includes a flip-flop 610, a first NOR gate 630, and a second NOR gate 650.

A clock signal CLK is input to a clock terminal CK of the flip-flop 610, an inverted clock signal CLKB is input to an inverted clock terminal CKB of the flip-flop 610, and a signal output from an inverted output terminal QB of the flip-flop 610 is input to an input terminal D of the flip-flop 610. The clock signal CLK and the inverted clock signal CLKB are complementary to each other, and an output signal CLK2 and an inverted output signal CLK2B are complementary to each other.

The first NOR gate 630 receives and NORs the clock signal CLK and the output signal CLK2 output from the flip-flop 610, and outputs a signal CLK2_ODD as the result of the NOR operation. The output signal CLK2 output from the flip-flop 610 is a divided-by-2 signal of the clock signal CLK.

The second NOR gate 650 receives and NORs the clock signal CLK and the inverted output signal CLK2B output from the flip-flop 610, and outputs a signal CLK2_EVEN as the result of the NOR operation. The inverted output signal CLK2B is a divided-by-2 signal of the inverted clock signal CLKB. The flip-flop 610 is reset in response to a falling edge of a reset signal RESETB.

Figure 9:
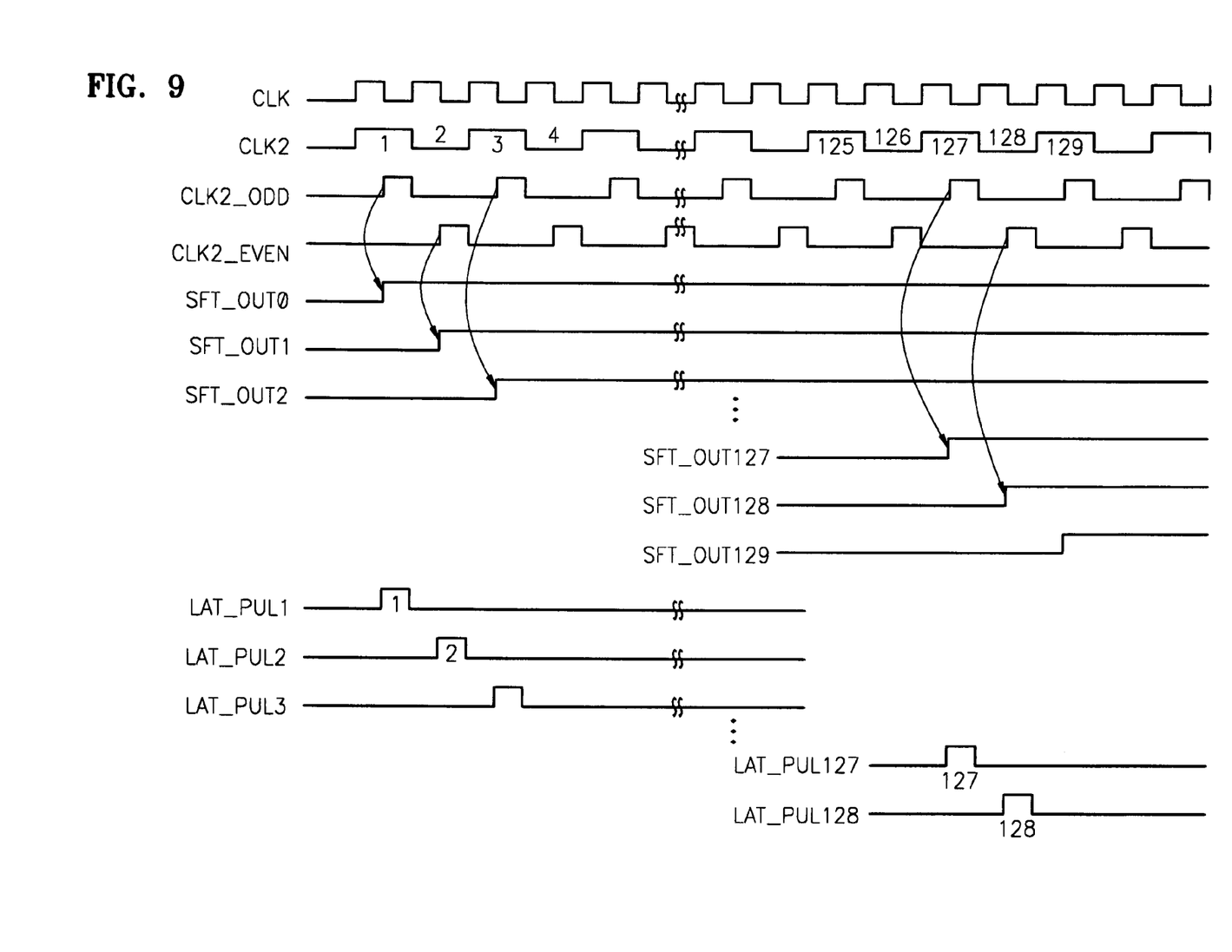
FIG. 9 is a timing diagram illustrating the operation of the pulse generator shown in FIG. 8.

The waveforms of the signal CLK2_ODD output from the first NOR gate 630 and the signal CLK2_EVEN output from the second NOR gate 650 are illustrated in FIG. 9. The divided-by-2 clock signals CLK2_EO shown in FIGS. 4 and 5 are equivalent or similar to the signal CLK2_ODD output from the first NOR gate 630 or the signal CLK2_EVEN output from the second NOR gate 650. Thus, the signal CLK2_ODD is a divided-by-2 odd-numbered clock signal and the signal CLK2_EVEN is a divided-by-2 even-numbered clock signal.

Figure 7:
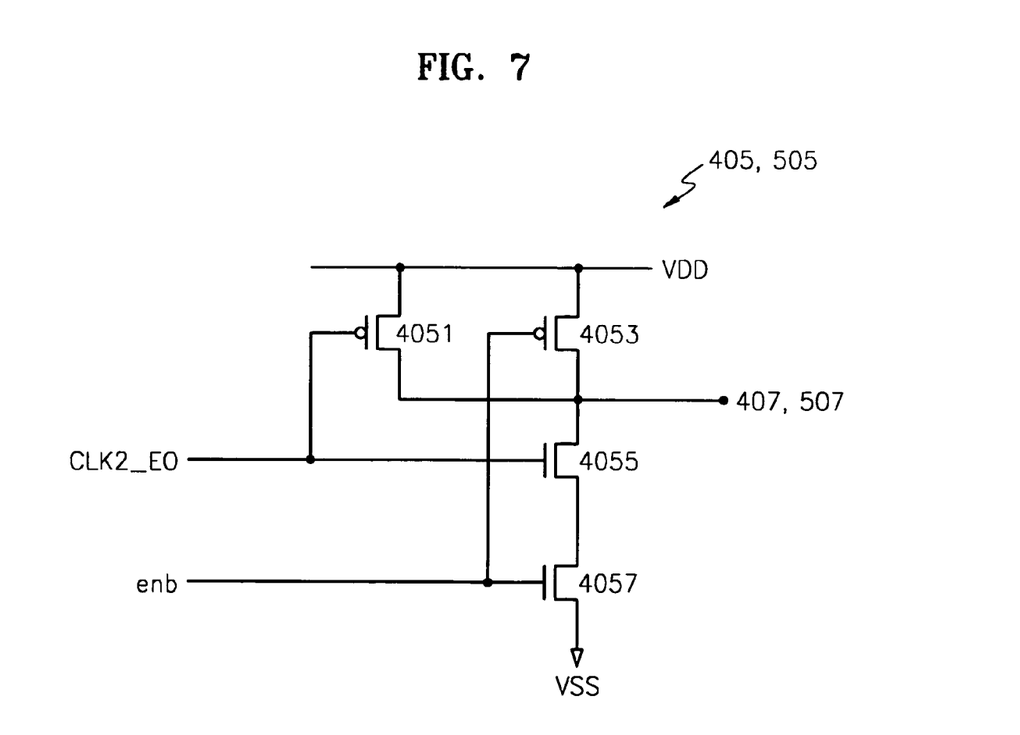
FIG. 7 is a circuit diagram of the NAND gates shown in FIGS. 4 and/or 5.

FIG. 7 is a circuit diagram of the NAND gates 405, 505 shown in FIGS. 4 and 5. Referring to FIG. 7, a first PMOS transistor 4051 and a second PMOS transistor 4053 are connected in parallel between a power supply voltage VDD and the output terminals 407, 507 of FIGS. 4 and 5 of the second NAND gates 405, 505. A first NMOS transistor 4055 and a second NMOS transistor 4057 are connected in series between the output terminals 407, 507 of the second NAND gates 405, 505 and a ground voltage VSS.

The divided-by-2 clock signal CLK2_EO is input to the gate of the first PMOS transistor 4051 and the gate of the first NMOS transistor 4055. A signal enb output from the first inverters 403, 503 of FIGS. 4 and 5 is input to the gate of the second PMOS transistor 4053 and the gate of the second NMOS transistor 4057.

Because the divided-by-2 clock signal CLK2_EO is input to the gate of the first PMOS transistor 4051 and the gate of the first NMOS transistor 4055, only the first PMOS transistor 4051 and the first NMOS transistor 4055 toggle in response to the divided-by-2 clock signal CLK2_EO.

On the other hand, in the conventional pulse generator 100 shown in FIGS. 1 and 2, the transistors 1101, 1103, 1105, 1107, 1111, 1113, 1115, and 1117, the transistors of the inverter 120, and the transistors of the NAND gate 130 all toggle in response to the clock signal CLK. Therefore, the power consumed by the pulse generators 400, 500 of FIGS. 4 and 5 with the NAND gates 405, 505, shown in FIG. 7 is significantly smaller than the power consumed by the pulse generator 100 shown in FIG. 1.

Figure 8:
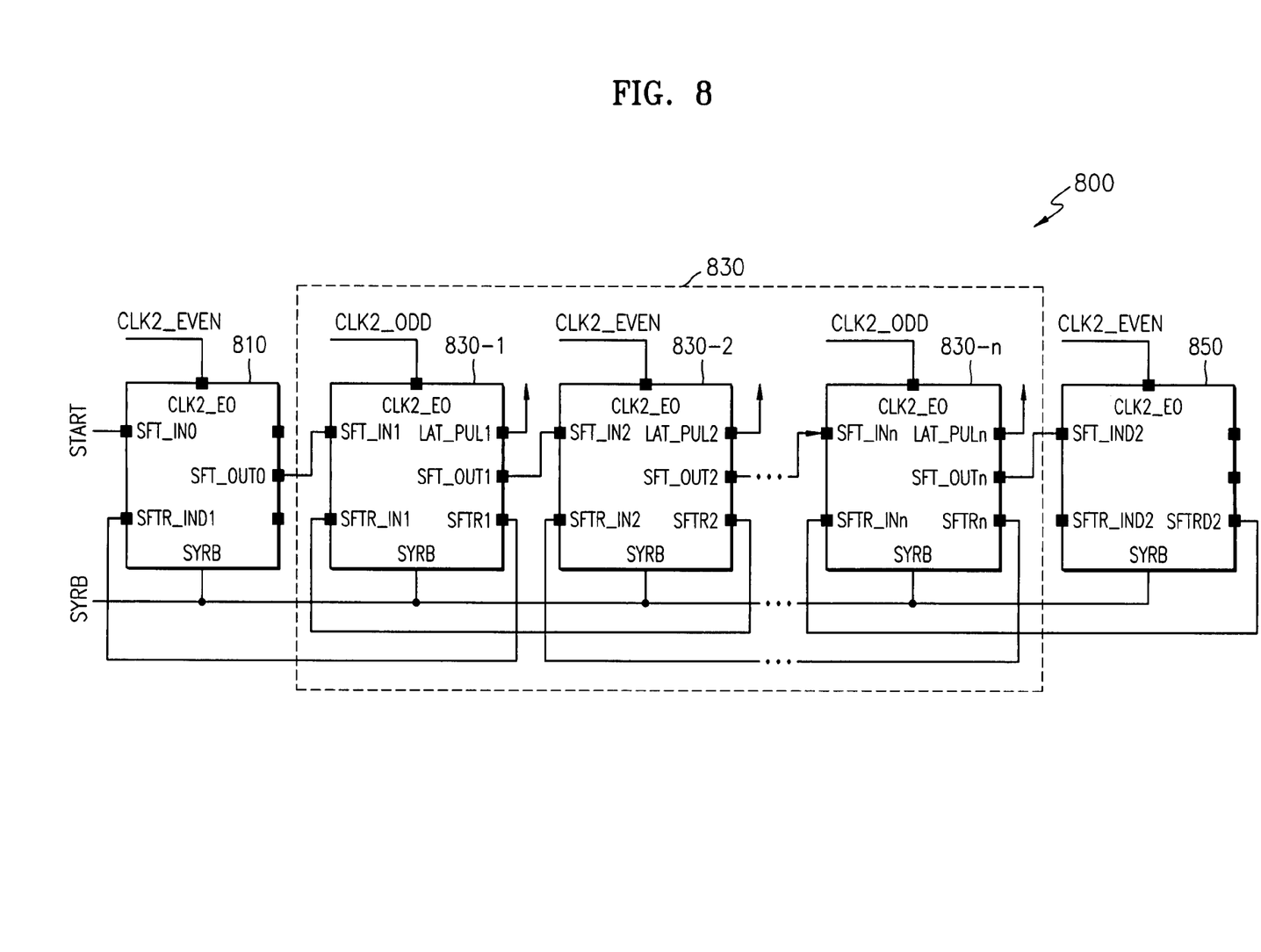
FIG. 8 is a circuit diagram of a pulse generator capable of sequentially latching n data.

FIG. 8 is a circuit diagram of a pulse generator 800 capable of sequentially latching n data. Referring to FIG. 8, the pulse generator 800 includes a first dummy unit cell 810, a pulse generator set 830, and a second dummy unit cell 850.

The pulse generator set 830 includes n unit cells 830_1, 830_2 ... 830_n. Each of the n unit cells 830_1, 830_2 ... 830_n has the same or similar construction and function as the pulse generator 400, 500 of FIGS. 4 and 5. The $n^{th}$ unit cell 830_1 outputs the divided-by-2 odd-numbered clock signal CLK2_ODD as an output signal LAT-PUL1 in response to the divided-by-2 odd-numbered clock signal CLK2_ODD, an output signal SFT_OUT0 output from the $(n-1)^{th}$ (i.e., first dummy) unit cell 810, and an output signal SFTR2 output from the $n+1^{th}$ unit cell 830_2.

More specifically, the $n^{th}$ unit cell 830_1 is reset in response to the logic level of the signal SFTR2 output from the $(n+1)^{th}$ unit cell 830_2, or outputs an output signal LAT_PUL as a pulse whose width is equivalent to the width of the divided-by-2 odd-numbered clock signal CLK2_ODD. The pulse LAT_PUL is used to latch data input to a source data line of for example, an active matrix type thin film transistor liquid crystal display (TFT_LCD) driver.

Thus, when the inverted output signal enb output from the first inverters 403, 503 of FIGS. 4 and 5 is at a logic low level, the pulse generators 400, 500 output a deactivated output signal LAT_PUL, i.e., LAT_PUL is at a logic low level, irrespective of the level of the divided-by-2 clock signal CLK2_EO. However, when the output signal enb output from the first inverters 403, 503 is at a logic high level, the pulse generators 400, 500 output as the output signal LAT_PUL a pulse whose width is equivalent to the width of the clock signal CLK2_EO.

In the unit cell 830_1, the divided-by-2 clock signal CLK2_ODD is input to its first input terminal, a signal SFT_OUT0 output from a second output terminal of the first dummy unit cell 810 is input to its second input terminal, and a signal SFTR2 output from a third output terminal of the unit cell 830_2 is input to its third input terminal.

In the $n^{th}$ unit cell 803_n, the divided-by-2 odd-numbered clock signal CLK2_ODD is input to its first input terminal, a signal output from a second output terminal of the $(n-1)^{th}$ unit cell is input to its second input terminal, and a signal SFTRD2 output from a third output terminal of the second dummy unit cell 850 is input to its third input terminal. A signal LAT_PULn output from a first output terminal of the $n^{th}$ unit cell 830_n is used as a signal for latching $n^{th}$ data.

FIG. 9 is a timing diagram illustrating the operation of the pulse generator 800, shown in FIG. 8. The operation of the pulse generator 800 will be described in detail with reference to FIGS. 4–9.

First, a case where 128 data bits are sequentially latched is explained. The clock signal generating circuit 600 of FIG. 6 alternately generates the divided-by-2 odd-numbered clock signal CLK2_ODD and the divided-by-2 even-numbered clock signal CLK2_EVEN in response to the clock signal CLK and the inverted clock signal CLKB.

The first dummy unit cell 810 outputs an activated signal SFT_OUT0 as an input signal SFT_IN1 to the unit cell 830_1 when the start signal START input as an input signal SFT_IN0 to the second input terminal of the first dummy unit cell 810 is activated and an activated signal SFTR1 output from a third output terminal of the activated unit cell 830_1 is input as an input signal SFTR_IND1 to the third input terminal of the first dummy unit cell 810.

The unit cell 830_1 generates the pulse LAT_PUL1 whose width is equivalent to the width of the divided-by-2 odd-numbered clock signal CLK2_ODD in response to the activated input signal SFT_IN1 and the output signal SFTR2 output from the unit cell 830_2, and outputs an activated output signal SFT_OUT1 and the deactivated output signal SFTR1, respectively. Accordingly, the first dummy unit cell 810 is reset in response to the deactivated output signal SFTR1.

The activated signal SFT_OUT1 output from the unit cell 830_1 is input as an input signal SFT_IN2 to the unit cell 830_2. The unit cell 830_2 generates a pulse LAT_PUL2 whose width is equivalent to the width of a divided-by-2 even-numbered clock signal CLK2_EVEN in response to the activated input signal SFT_IN2 and an activated output signal SFTR3 output from a third unit cell, and activates and outputs an activated output signal SFT_OUT2 and the deactivated output signal SFTR2. The unit cell 830_1 is reset in response to the deactivated output signal SFTR2.

The above operations of the pulse generator 800 are repeated until 128 source data bits are latched. Therefore, 128 pulses are sequentially generated by each of 128 unit cells 830_1, 830_2 ... 830_n.

While this invention has been particularly shown and described with reference to exemplary embodiments thereof, it will be understood by those skilled in the art that various changes in form and details may be made therein without departing from the spirit and scope of the invention as defined by the appended claims and their equivalents.

What is claimed is:

1. A pulse generator comprising a plurality of unit cells, wherein an $n^{th}$ unit cell (n is a natural number more than 2) generates a pulse in response to a divided-by-N clock signal (N is a natural number), a signal output from an $(n-1)^{th}$ unit cell and a signal output from an $(n+1)^{th}$ unit cell, wherein the $n^{th}$ unit cell comprises:

a first NAND gate that NANDs the signal output from the $(n-1)^{th}$ unit cell and the signal output from the $(n+1)^{th}$ unit cell;

a first inverter that inverts a signal output from the first NAND gate;

a second NAND gate that NANDs the divided-by-N clock signal and a signal output from the first inverter;

a second inverter that inverts a signal output from the second NAND gate and outputs the pulse as an inverted signal; and a latch that latches a reset signal and the signal output from the second NAND gate.

2. The pulse generator of claim 1, wherein the $n^{th}$ unit cell is reset or generates the pulse, the width of the pulse being equivalent to the width of the divided-by-N clock signal, based on the logic level of the signal output from the $(n-1)^{th}$ unit cell and the logic level of the signal output from the $(n-1)^{th}$ unit cell.

3. The pulse generator of claim 1, wherein phases of the signal output from the $(n-1)^{th}$ unit cell and the signal output from the $(n+1)^{th}$ unit cell are changed with a time difference.

4. The pulse generator of claim 1, wherein the second NAND gate comprises:

first and second positive metal oxide semiconductor (PMOS) transistors; and first and second negative metal oxide semiconductor (NMOS) transistors, wherein the divided-by-N clock signal is input to a gate of the first PMOS transistor and a gate of the first NMOS transistor, and a signal output from the first inverter is input to a gate of the second PMOS transistor and a gate of the second NMOS transistor.

5. A pulse generator comprising a plurality of unit cells, wherein a divided-by-N clock signal (N is a natural number), a signal output from a second output terminal of an n−1 unit cell (n is a natural number more than 2), and a signal output from a third output terminal of an n+1$^{th}$ unit cell are input to a first input terminal, a second input terminal, and a third input terminal of an n$^{th}$ unit cell of the plurality of unit cells, wherein the n$^{th}$ unit cell outputs a pulse whose width is equivalent to the width of the divided-by-N clock signal to a first output terminal of the n$^{th}$ unit cell in response to the signals that are input to the first, second and third input terminals of the n$^{th}$ unit cell, wherein the n$^{th}$ unit cell comprises:

a first NAND gate that NANDs the signal which is output from the n−1$^{th}$ unit cell and input to the second input terminal of the n$^{th}$ unit cell, and the signal which is output from the n+1$^{th}$ unit cell and input to the third input terminal of the n$^{th}$ unit cell;

a first inverter that inverts a signal output from the first NAND gate;

a second NAND gate that NANDs the divided-by-N clock signal input to the first input terminal of the n$^{th}$ unit cell and a signal output from the first inverter;

a second inverter that inverts a signal output from the second NAND gate and outputs an inverted signal as the output signal of the n$^{th}$ unit cell; and a latch that latches a reset signal, and a signal output from the second NAND gate.

6. The pulse generator of claim 5, wherein the n$^{th}$ unit cell is reset or outputs the pulse whose width is equivalent to the width of the divided-by-N clock signal to the first output terminal of the nth unit cell, based on the logic level of the signal output from the third output terminal of the (n+1)$^{th}$ unit cell.

7. The pulse generator of claim 5, wherein phases of the signal output from the second output terminal of the n−1$^{th}$ unit cell and the signal output from the third output terminal of the n+1$^{th}$ unit cell are changed with a time difference.

8. The pulse generator of claim 5, wherein the second NAND gate comprises:

first and second PMOS transistors; and
first and second NMOS transistors,
wherein the divided-by-N clock signal is input to a gate of the first PMOS transistor and a gate of the first NMOS transistor, and the signal output from the first inverter is input to a gate of the second PMOS transistor and a gate of the second NMOS transistor.

9. A pulse generator comprising a plurality of unit cells, wherein a divided-by-N clock signal (N is a natural number), a signal output from a second output terminal of an n−1$^{th}$ unit cell (n is a natural number more than 2), and a signal output from a third output terminal of an n+1$^{th}$ unit cell are input to a first input terminal, a second input terminal, and a third input terminal of an n$^{th}$ unit cell of the plurality of unit cells, wherein the n$^{th}$ unit cell outputs a pulse whose width is equivalent to the width of the divided-by-N clock signal to a first output terminal of the n$^{th}$ unit cell in response to the signals that are input to the first, second and third input terminals of the n$^{th}$ unit cell, wherein the n$^{th}$ unit cell comprises:

a first NAND gate that NANDs the signal which is output from the n−1$^{th}$ unit cell and input via the second input terminal of the n$^{th}$ unit cell, and the signal which is output from the n+1$^{th}$ unit cell and input via the third input terminal of the n$^{th}$ unit cell;

a first inverter that inverts a signal output from the first NAND gate;

a second NAND gate that NANDs the divided-by-N clock signal input via the first input terminal of the n$^{th}$ unit cell and a signal output from the first inverter;

a second inverter that inverts a signal output from the second NAND gate and outputs an inverted signal as an output signal of the n$^{th}$ unit cell;

a first transmission circuit that responds to the signal output from the second NAND gate and the signal output from the second inverter;

a second transmission circuit that responds to the signal output from the second NAND gate and the signal output from the second inverter;

a third NAND gate that NANDs a reset signal and a signal output from the shared node and outputs the result of NAND to the third output terminal of the n$^{th}$ unit cell; and a third inverter that inverts the signal output from the third NAND gate and outputs an inverted signal to the second output terminal of the n$^{th}$ unit cell.

10. The pulse generator of claim 9, wherein the second NAND gate comprises:

first and second PMOS transistors; and
first and second NMOS transistors,
wherein the divided-by-N clock signal input to the first input terminal of the n$^{th}$ unit cell is input to a gate of the first PMOS transistor and a gate of the first NMOS transistor, and the signal output from the second inverter is input to a gate of the second PMOS transistor and a gate of the second NMOS transistor.

* * * * *